US010170318B2

(12) United States Patent
Tang et al.

(10) Patent No.: US 10,170,318 B2
(45) Date of Patent: Jan. 1, 2019

(54) SELF-ALIGNED CONTACT AND MANUFACTURING METHOD THEREOF

(71) Applicant: Taiwan Semiconductor Manufacturing Company, Ltd., Hsinchu (TW)

(72) Inventors: Bang-Tai Tang, New Taipei (TW); Tai-Chun Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/889,400

(22) Filed: Feb. 6, 2018

(65) Prior Publication Data

US 2018/0315608 A1 Nov. 1, 2018

Related U.S. Application Data

(60) Provisional application No. 62/491,755, filed on Apr. 28, 2017.

(51) Int. Cl.

| | |
|---|---|
| ***H01L 29/423*** | (2006.01) |
| ***H01L 21/28*** | (2006.01) |
| ***H01L 29/66*** | (2006.01) |
| ***H01L 21/02*** | (2006.01) |
| ***H01L 21/311*** | (2006.01) |
| *H01L 21/3115* | (2006.01) |
| *H01L 21/8234* | (2006.01) |
| *H01L 27/12* | (2006.01) |

(52) U.S. Cl.

CPC .... *H01L 21/28247* (2013.01); *H01L 21/0217* (2013.01); *H01L 21/0228* (2013.01); *H01L 21/02211* (2013.01); *H01L 21/02321* (2013.01); *H01L 21/02337* (2013.01); *H01L 21/31111* (2013.01); *H01L 21/31116* (2013.01); *H01L 29/6653* (2013.01); *H01L 29/66545* (2013.01); *H01L 29/66795* (2013.01); *H01L 21/31155* (2013.01); *H01L 21/823437* (2013.01); *H01L 27/1288* (2013.01); *H01L 29/42312* (2013.01)

(58) Field of Classification Search

CPC ........... H01L 27/1288; H01L 29/42312; H01L 29/66545; H01L 21/823437

USPC .......................................... 257/288; 438/585

See application file for complete search history.

(56) References Cited

U.S. PATENT DOCUMENTS 8,877,580 B1 * 11/2014 Chen ................ H01L 21/28008 438/221

9,105,490 B2 8/2015 Wang et al.

(Continued)

*Primary Examiner* — George Fourson, III

(74) *Attorney, Agent, or Firm* — Slater Matsil, LLP

(57) ABSTRACT

A semiconductor device and a method of forming the semiconductor device are disclosed. A method includes forming a gate stack over a semiconductor structure. The gate stack is recessed to form a first recess. A first dielectric layer is formed along a bottom and sidewalls of the first recess, the first dielectric layer having a first etch rate. A second dielectric layer is formed over the first dielectric layer, the second dielectric layer having a second etch rate, the first etch rate being higher than the second etch rate. A third dielectric layer is formed over the second dielectric layer. An etch rate of a portion of the third dielectric layer is altered. The first dielectric layer, the second dielectric layer, and the third dielectric layer are recessed to form a second recess. A capping layer is formed in the second recess.

20 Claims, 14 Drawing Sheets

606
$T_3$ $T_2$ $T_1$
904
$T_{total}$
906
$904_3$
$904_2$
$904_1$
332
118 504 502 230

606
908
$904_3$
$904_2$
602
$904_1$
332
118 504 502 230

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,240,454 | B1 * | 1/2016 | Liu .................. H01L 29/66628 |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2017/0162396 | A1 * | 6/2017 | Tsai .................. H01L 21/28247 |
| 2018/0277430 | A1 * | 9/2018 | Xie .................. H01L 21/76879 |
| 2018/0286959 | A1 * | 10/2018 | Wang .................. H01L 29/4232 |
| 2018/0294267 | A1 * | 10/2018 | Licausi ............. H01L 27/10867 |
| 2018/0331217 | A1 * | 11/2018 | Chi .................. H01L 29/66666 |

* cited by examiner

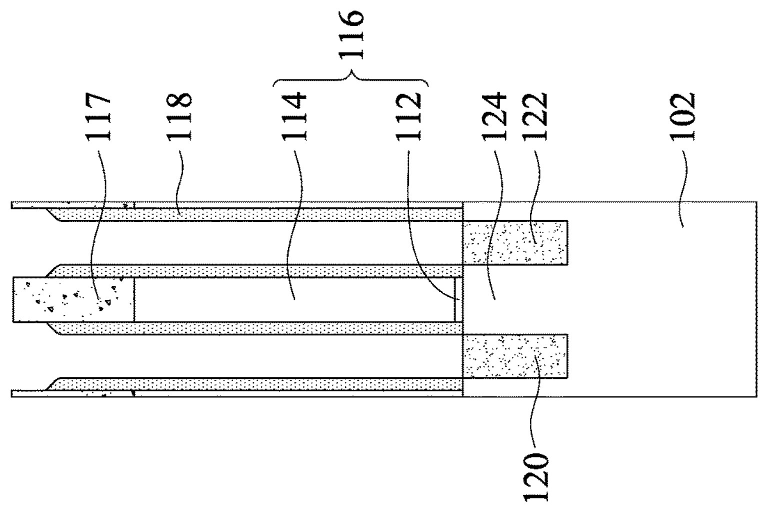
FIG. 1C
120
106
104
102
110
FIG. 1B
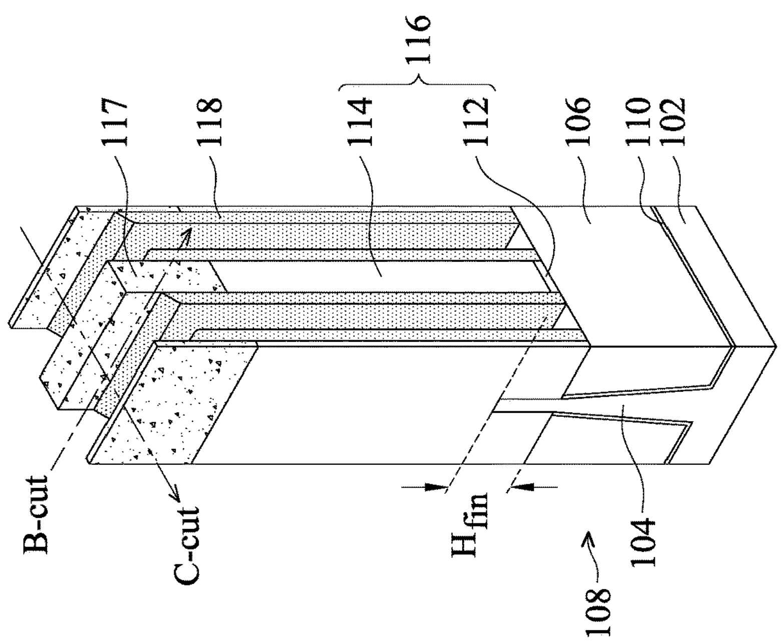
FIG. 1A

SELF-ALIGNED CONTACT AND MANUFACTURING METHOD THEREOF

This application claims the benefit of U.S. Provisional Patent Application Ser. No. 62/491,755, filed on Apr. 28, 2017, entitled "Self-Aligned Contact and Manufacturing Method Thereof," which application is hereby incorporated herein by reference in its entirety.

BACKGROUND

Metal-oxide-semiconductor field-effect transistors (FETs or MOSFETs) are widely used in integrated circuits (ICs). To increase the density of MOSFETs in ICs, physical dimensions such as gate length LG of MOSFETs are aggressively reduced. MOSFETs with short LG may suffer from undesirable short-channel effects (SCEs), such as high off-state leakage current and high drain-induced barrier lowering.

To suppress SCEs in transistors having short gate lengths LG, the multiple-gate field-effect transistor (MuGFET) architecture may be employed. A MuGFET has better electrostatic control of the channel potential by the gate electrode, as compared to a planar device structure. MuGFETs include examples such as the double-gate transistor and tri-gate or triple-gate transistor. A double-gate transistor is also known as a double-gate FinFET. A tri-gate transistor may be referred to as tri-gate FinFET, or simply FinFET. Double-gate or tri-gate devices employ a channel that resembles a fin. The on-state or saturation drive current IDsat flows in a fin to achieve high current density per footprint or layout area.

Other MuGFETs include pi-gate, omega-gate, surround-gate (SG) or gate-all-around (GAA) structure, where the electrostatic gate control is further improved. The SG transistor has a channel that is similar to a nanowire, where the nanowire may be oriented horizontally or vertically. For a horizontal nanowire transistor, several horizontally-oriented nanowire channels may be vertically stacked.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A though 9I are various views of intermediate process steps in a fabrication process of a semiconductor device in accordance with some embodiments.

DETAILED DESCRIPTION

Figure 2C:
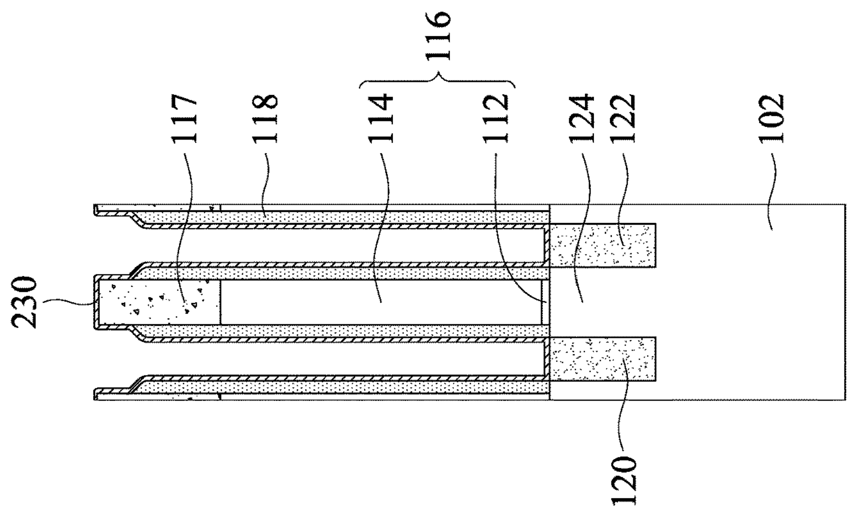

It is understood that this disclosure provides many embodiments or examples for implementing this invention. Specific examples are described below, and are not intended to be limiting. The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments relate to a method of forming a contact for multiple-gate field-effect transistors, including a method of forming self-align contacts. The embodiments such as those disclosed herein are generally applicable to double-gate or triple-gate FinFETs, surround-gate or gate-all-around transistors and/or nanowire transistors.

For purposes of illustration, the Figures and the following discussion refer to one fin and three gates. It is noted, however, that in other embodiments more fins may be used and fewer or greater gates may be used. Furthermore, other structures may be used. For example, epitaxial regions of adjacent fins may be joined to form a single larger source/drain region.

FIGS. 1A-8C are perspective and cross-sectional views of intermediate stages in the manufacturing of a FinFET and the respective contacts in accordance with some embodiments. The variations of the embodiments are discussed. Throughout the various views and illustrative embodiments, like reference numbers are used to designate like elements. In FIGS. 1A-8C, the "A" figures (e.g., FIG. 1A, 2A, etc.) illustrate a perspective view, the "B" figures (e.g., FIG. 1B, 2B, etc.) illustrate a cross-sectional view along the B-cut line illustrated in the respective "A" figure, and the "C" figures (e.g., FIG. 1C, 2C, etc.) illustrate a cross-sectional view along the C-cut line illustrated in the respective "A" figure.

Referring first to FIGS. 1A-1C, there is shown a substrate 102 having one or more fins, with one fin 104 being illustrated. It is understood that one fin is illustrated for purposes of illustration, but other embodiments may include any number of fins. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 102 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

The substrate 102 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 102 to generate the structural and functional requirements of the design for the resulting FinFET device. The integrated circuit devices may be formed using any suitable methods.

The fin 104 may be formed using, for example, a patterning process to form trenches 108 such that the fin 104 is formed between adjacent trenches 108. In some embodiments, photolithography techniques are utilized to pattern a masking layer (not shown). Generally, a photoresist material (not shown) is deposited over the masking layer. The photoresist material is irradiated (exposed) to energy, e.g. light, through a patterned reticle in order to induce a reaction in those portions of the photoresist material exposed to the energy. The photoresist material is developed to remove a portion of the photoresist material, wherein the remaining photoresist material protects the underlying material from subsequent processing steps, such as etching. As discussed in greater detail below, the fin 104 will be used to form a MuGFET. An example of the crystal orientation of a channel sidewall surface may be, for example, (110) and a channel top surface may be (001). The channel sidewall surface may be of other crystal orientations, such as (551). The channel sidewall and the channel top surface may have other crystal orientations.

In some embodiments, the fins 104 may be formed by any suitable method. For example, the fins 104 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 102 and patterned using a photolithography process. Spacers are formed alongside the patterned sacrificial layer using a self-aligned process. The sacrificial layer is then removed, and the remaining spacers, or mandrels, may then be used to pattern the substrate 102 to form the fins 104.

Isolation regions, such as Shallow Trench Isolations (STIs) 106, are formed along sidewalls of the fin 104 in the trenches 108. Prior to forming the STIs 106, one or more liners (collectively referred to as a liner 110) are formed over the substrate 102 and sidewalls of the fins 104. In some embodiments, the liner 110 has a single layer structure with a thickness between about 10 Å and about 50 Å. In other embodiments, the liner 110 has a bilayer structure comprising a first liner sub-layer and a second liner sub-layer. In some embodiments, the first liner sub-layer comprises silicon oxide and has a thickness between about 5 Å and about 20 Å, and the second liner sub-layer comprises silicon nitride and has a thickness between about 5 Å and about 30 Å. The liner 110 may be deposited through one or more processes such as physical vapor deposition (PVD), chemical vapor deposition (CVD), or atomic layer deposition (ALD), although any acceptable process may be utilized. In some embodiments, the trenches 108 have a depth from a top of the fin 104 from about 500 Å to about 3000 Å. Other materials, dimensions, and/or processes may be used.

The STIs 106 may be made of suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations of these, or the like. In some embodiments, the STIs 106 are formed through a process such as CVD, flowable CVD (FCVD), or a spin-on-glass process, although any acceptable process may be utilized. Subsequently, portions of the STIs 106 extending over the top surfaces of the fins 104, and portions of the liner 110 over the top surfaces of the fins 104 are removed using, for example, an etch process, chemical mechanical polishing (CMP), or the like.

In some embodiments, the STIs 106 and the liner 110 are recessed to expose sidewalls of the fins 104 as illustrated in FIGS. 1A-1C. In some embodiments, the STIs 106 and the liner 110 are recessed using one or more selective etch processes utilizing the fins 104 as an etch mask. For example, the STIs 106 and the liner 110 are recessed using a single etch processes. In alternative embodiments, the STIs 106 and the liner 110 are recessed using a multiple etch processes. For example, the STI 106 is recessed using a first etch process utilizing the fins 104 and the liner 110 as an etch mask, and subsequently, the liner 110 is recessed using a second etch process. In embodiments in which the STI 106 comprise silicon oxide, the etch process may be, for example, a dry etch, a chemical etch, or a wet cleaning process. For example, the chemical etch may employ fluorine-containing chemical such as dilute hydrofluoric (dHF) acid. After recessing the STIs 106 and the liner 110, a fin height $H_{fin}$ of the fins 104 above a top surface of the STIs 106 may be 30 nm or higher, such as 50 nm or higher. It is understood that the fin height may be modified by subsequent processing.

FIGS. 1A-1C further illustrate a dummy gate dielectric 112 and a dummy gate electrode 114 formed over the exposed fin 104 in accordance with some embodiments. The dummy gate dielectric 112 and the dummy gate electrode 114 will be subsequently used to define and form the source/drain regions. In some embodiments, the dummy gate dielectric 112 and the dummy gate electrode 114 are formed by depositing and patterning a dummy gate dielectric layer (not shown) formed over the exposed fins 104 and a dummy gate electrode layer (not shown) over the dummy gate dielectric layer. The dummy gate dielectric layer may be formed by thermal oxidation, ALD, CVD, sputtering, or any other methods known and used in the art for forming a dummy gate dielectric layer. In some embodiments, the dummy gate dielectric layer may be formed of a same material as the STIs 106. In other embodiments, the dummy gate dielectric 112 may be made of one or more suitable dielectric materials such as silicon oxide, silicon nitride, SiCN, SiON, $Si_3N_4$, and $SiN_xH_y$, low-k dielectrics such as carbon doped oxides, extremely low-k dielectrics such as porous carbon doped silicon dioxide, a polymer such as polyimide, the like, or a combination thereof. In some embodiments, the dummy gate dielectric layer includes dielectric materials having a high dielectric constant (k value), for example, greater than 3.9. The materials may include metal oxides such as $HfO_2$, $HfZrO_x$, $HfSiO_x$, $HfTiO_x$, $HfAlO_x$, the like, or combinations and multi-layers thereof.

Subsequently, the dummy gate electrode layer is formed over the dummy gate dielectric layer. In some embodiments, the dummy gate electrode layer is a conductive material and may be selected from a group comprising amorphous silicon, polysilicon, amorphous germanium, poly germanium, amorphous silicon-germanium, poly silicon-germanium, metallic nitrides, metallic silicides, metallic oxides, and metals. In an embodiment, the dummy gate electrode layer may be deposited by PVD, CVD, sputter deposition, or other techniques known and used in the art for depositing conductive materials. Other materials, conductive and non-conductive, may be used. The top surface of the dummy gate electrode layer usually has a non-planar top surface and may be planarized after it is deposited.

A hardmask, such as a dummy gate mask 117, may be formed over the dummy gate electrode layer to aid in the patterning. The dummy gate mask 117 comprises one or more masking layers and will be used to pattern the dummy gate dielectric layer and the dummy gate electrode layer to form the dummy gate dielectric 112 and the dummy gate electrode 114 as illustrated in FIGS. 1A-1C. The dummy gate mask 117 may comprise one or more layers. In some embodiments, the dummy gate mask 117 may be formed of $SiO_2$, SiCN, SiON, $Si_3N_4$, $Al_2O_3$, $SiN_xH_y$, or other suitable materials.

In some embodiments, the dummy gate mask 117 comprises a first hardmask layer and a second hardmask layer. The first hardmask layer may be an oxide layer (e.g., silicon oxide) and the second hardmask layer may be a nitride (e.g., silicon nitride). The first hardmask layer and the second hardmask layer may be deposited through a process such as ALD, CVD, PVD, or a spin-on-glass process, although any acceptable process may be utilized. The first hardmask layer may have a thickness from about 10 Å to about 250 Å and the second hardmask layer may have a thickness from about 150 Å to about 850 Å. The dummy gate electrode 114 and the dummy gate dielectric 112 collectively form a dummy gate stack 116. The dummy gate dielectric 112 may have a thickness from about 30 Å to about 50 Å. The dummy gate electrode 114 may have a thickness from about 40 nm to about 60 nm.

Sidewall spacers 118 are formed along sidewalls of the dummy gate stack 116 in accordance with some embodiments. The sidewall spacers 118 may be formed by depositing and patterning a spacer layer (not shown) over the dummy gate stack 116, the fin 104, and the STIs 106. In some embodiments, spacer layer is formed of silicon nitride, and may have a single-layer structure. In alternative embodiments, the spacer layer may have a composite structure including a plurality of layers. For example, the spacer layer may include a silicon oxide layer and a silicon nitride layer over the silicon oxide layer. Other materials, such as $SiO_2$, SiCN, SiON, $Si_3N_4$, $SiN_xH_y$, SiOCN, other low k material, or combinations thereof, may also be used. In some embodiments, the spacer layer may have a thickness from about 20 Å to about 30 Å.

The spacer layer may be patterned to form sidewall spacers 118 using, for example, an anisotropic etch process to remove the spacer layer over horizontal portions of the device and along sidewalls of the dummy gate stack 116. Due to the difference in the thicknesses of the spacer layer over horizontal portions of the device and along sidewalls of the fin 104, the spacer layer remains along sidewalls of the dummy gate stacks 116 while the fins 104 are exposed in the source/drain regions as illustrated in FIGS. 1A-1C.

It is noted that the figures illustrate three gate electrodes for illustrative purposes. The gate electrode in the middle may represent an active gate electrode while the gate electrodes on either side are dummy gate electrodes (e.g., non-active) used for patterning purposes in some embodiments. In other embodiments, all of the gate electrodes may be active gate electrodes.

FIGS. 1A-1C further illustrate a first source/drain region 120 and a second source/drain region 122 formed on exposed portions of the fins 104 along opposing sides of the dummy gate stack 116 in accordance with some embodiments. In some embodiments, the fin 104 may be recessed and the first source/drain region 120 and the second source/drain region 122 are epitaxially formed on the exposed portion of the recessed fin 104. Accordingly, the first source/drain region 120 and the second source/drain region 122 may also be referred to as the first epitaxial source/drain region 120 and the second epitaxial source/drain region 122, respectively. The use of epitaxially grown materials in the source/drain regions allows for the source/drain regions to exert stress in the channel region 124. The materials used for the first source/drain region 120 and the second source/drain region 122 may be varied for the n-type and p-type FinFETs, such that one type of material is used for the n-type FinFETs to exert a tensile stress in the channel region 124 and another type of material for the p-type FinFETs to exert a compressive stress in the channel region 124. For example, in some embodiments where the channel region 124 is formed of silicon, SiP or SiC may be used to form n-type FinFETs, and SiGe or Ge may be used to form p-type FinFETs. Other materials may also be used.

In embodiments in which different materials are utilized for the n-type devices and the p-type devices, it may be desirable to mask one (e.g., the n-type fins) while forming the epitaxial material on the other (e.g., the p-type fins), and repeating the process for the other. The first source/drain regions 120 and the second source/drain regions 122 may be doped either through an implanting process to implant appropriate dopants, or by in-situ doping as the material is grown. For example, for a p-channel MuGFET where the channel may be Si or $Si_{1-x}Ge_x$, the doped epitaxial film may be boron-doped $Si_{1-y}Ge_y$, where y is equal to or larger than x to induce longitudinal compressive strain in the channel for hole mobility enhancement. For an n-channel MuGFET where the channel may be Si, the doped epitaxial film may be, for example, phosphorus-doped silicon (Si:P) or silicon-carbon ($Si_{1-z}C_z$:P). In the case where the channel is a compound semiconductor such as $In_mGa_{1-m}As$, the doped epitaxial film may be, for example, $In_nGa_{1-n}As$, where n is smaller than or equal to m.

Figure 2B:
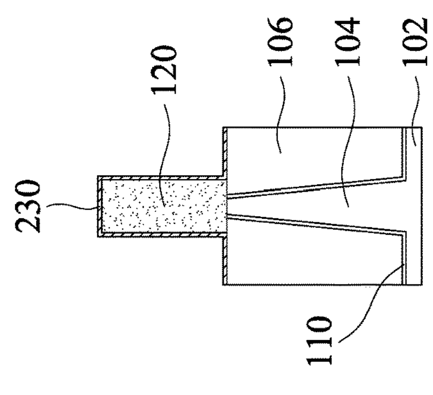
Figure 2A:
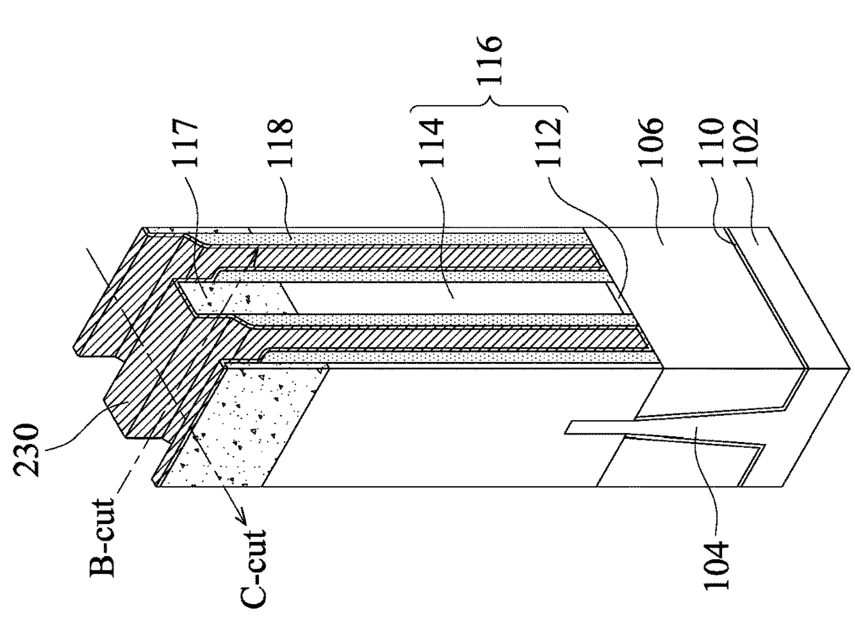

Referring now to FIGS. 2A-2C, a liner dielectric film 230 is deposited on top of the first source/drain region 120, the second source/drain region 122, the sidewalls spacers 118, and the dummy gate stack 116. In some embodiments, the liner dielectric film 230 comprises $SiO_2$, SiCN, SiON, $Si_3N_4$, and $SiN_xH_y$, but other suitable dielectric materials may be used. The liner may further comprise a plurality of layers that comprises combinations of the above mentioned materials. The liner dielectric film 230 may be deposited through one or more processes such as PVD, CVD, or ALD, although any acceptable process may be utilized. Other materials and/or processes may be used. In some embodiments, the liner dielectric film 230 has a thickness of about 5 nm or less, such as about 3 nm or less. Other thicknesses may be used.

Figure 3C:
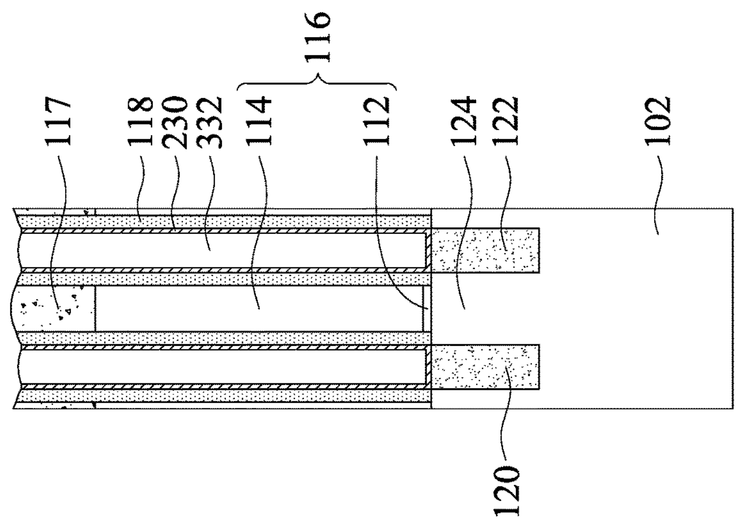
Figure 3B:
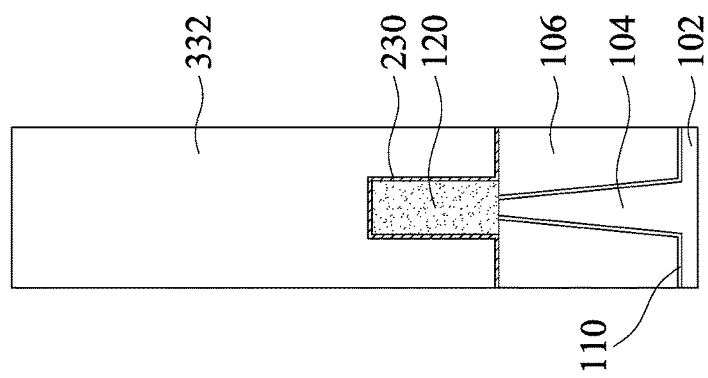
Figure 3A:
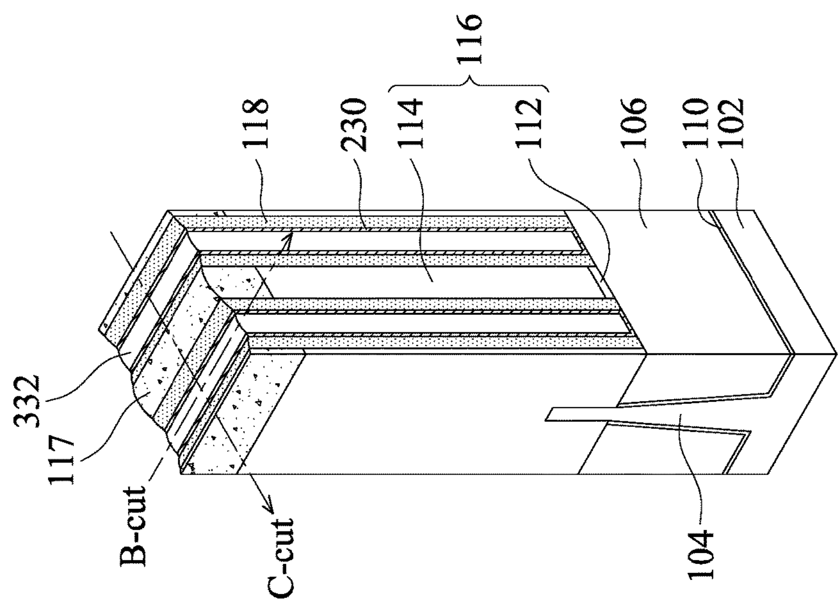

FIGS. 3A-3C illustrate formation of an interlayer dielectric (ILD) 332 over the liner dielectric film 230 in accordance with some embodiments. In an embodiment, the ILD 332 is a flowable film formed by a flowable CVD. In some embodiments, the ILD 332 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a spin-on-glass process, a combination thereof, or the like. In some embodiments, the liner dielectric film 230 may be used as a stop layer while patterning the ILD 332 to form openings for subsequently formed contacts. Accordingly, a material for the liner dielectric film 230 may be chosen such that the material of the liner dielectric film 230 has a lower etch rate than the material of ILD 332. Subsequently, portions of the liner dielectric film 230 and the ILD 332 extending over the top of the fins 104 are removed using, for example, an etch process, CMP, or the like. In some embodiments, such a process may partially or fully remove the dummy gate mask 117.

Figure 4C:
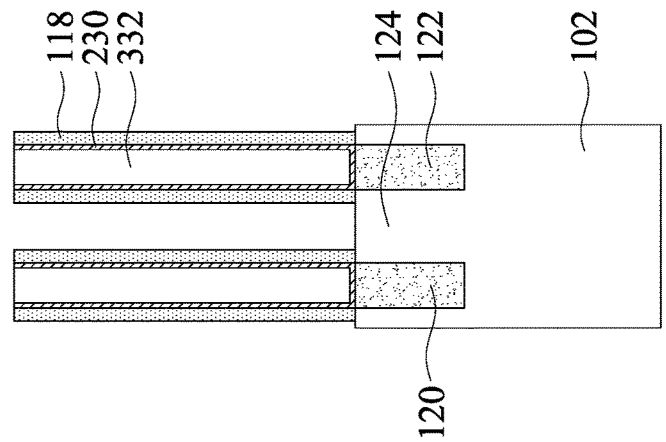
Figure 4B:
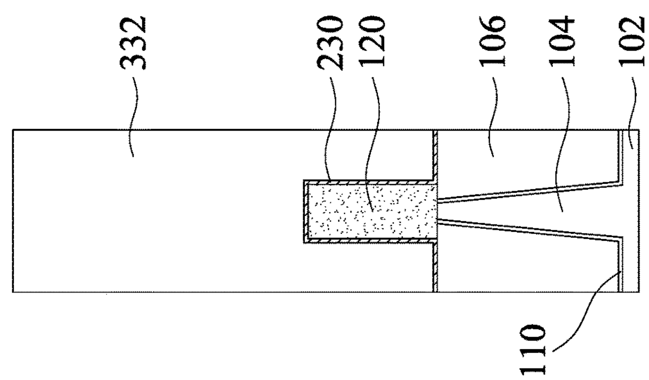
Figure 4A:
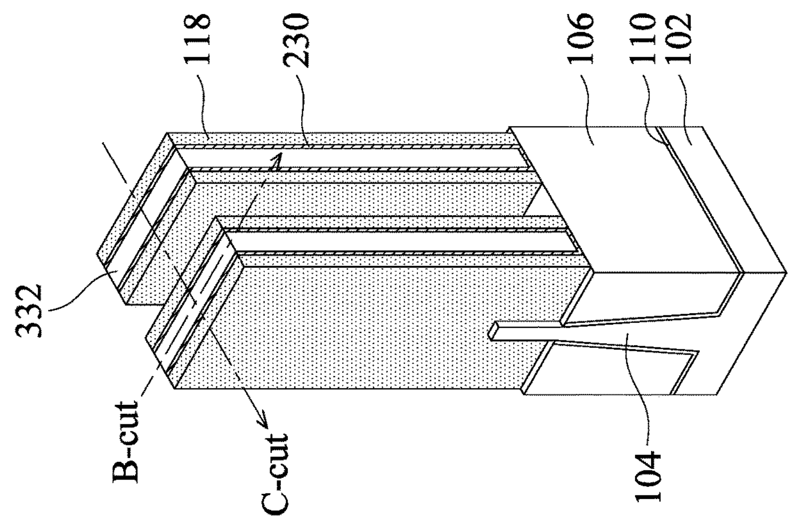

FIGS. 4A-4C illustrate removal of the dummy gate electrode 114 and the dummy gate dielectric 112 in accordance with some embodiments. The removal process may comprise one or more etch processes. For example in embodiments in which the dummy gate electrode 114 comprises polysilicon and the dummy gate dielectric 112 comprises silicon oxide, the removal process may comprise selectively etching using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH:H_2O_2:H_2O$ (APM), $NH_2OH$, KOH, $HNO_3:NH_4F:H_2O$, and/or the like. The dummy gate dielectric 112 may be removed using a wet etch process, such as a diluted HF (dHF) acid. Other processes and materials may be used.

Figure 5C:
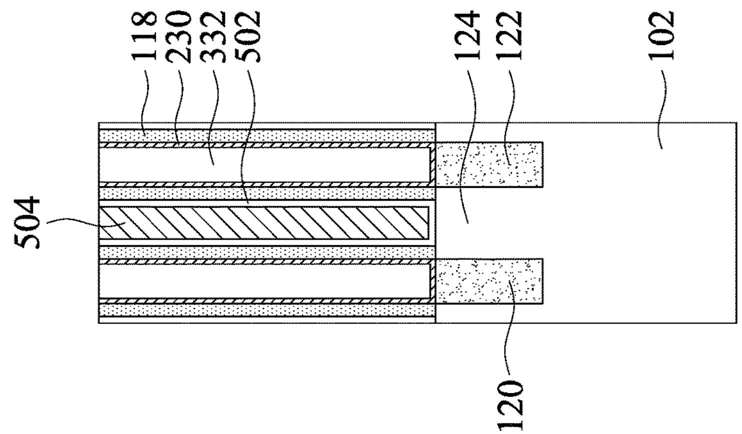
Figure 5B:
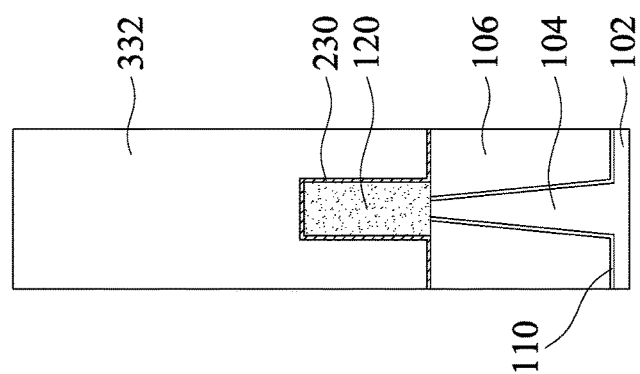
Figure 5A:
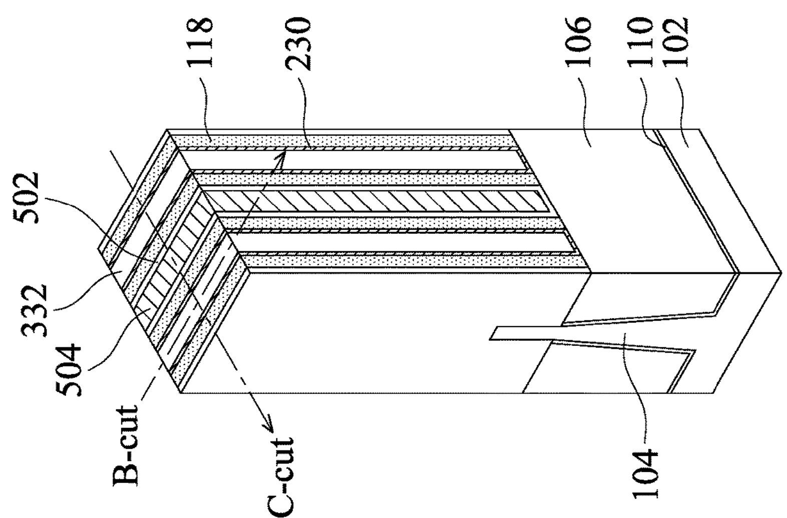

FIGS. 5A-5C illustrate formation of a gate dielectric layer 502 over a channel region 124 of the fin 104 in accordance with some embodiments. In an embodiment, the gate dielectric layer 502 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, $Si_3N_4$, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. The formation methods of gate dielectric layer 502 include molecular-beam deposition (MBD), ALD, PVD, and the like. In an embodiment, the gate dielectric layer 502 may have a thickness from about 3 Å to about 30 Å.

In some embodiments, an interfacial layer (not shown) may be formed over the channel region 124 prior to forming the gate dielectric layer 502, and the gate dielectric layer 502 is formed over the interfacial layer. The interfacial layer helps buffer the subsequently formed high-k dielectric layer from the underlying semiconductor material. In some embodiments, the interfacial layer is a chemical silicon oxide, which may be formed of chemical reactions. For example, a chemical oxide may be formed using deionized water+ozone (DIW+$O_3$), $NH_4OH+H_2O_2+H_2O$ (APM), or other methods. Other embodiments may utilize a different material or processes for the interfacial layer. In an embodiment, the interfacial layer may have a thickness from about 30 Å to about 50 Å.

FIGS. 5A-5C further illustrate a gate electrode 504 formed over the gate dielectric layer 502. The gate electrode 504 may be a metal selected from a group of W, Cu, Ti, Ag, Al, TiAl, TiAlN, TaC, TaCN, TaSiN, Mn, Co, Pd, Ni, Re, Ir, Ru, Pt, Zr, and a combination thereof. In some embodiments, the gate electrode 504 comprises a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the gate electrode 504 has a thickness in the range of about 5 nm to about 100 nm. The gate electrode 504 may be formed using a suitable process such as ALD, CVD, PVD, plating, or combinations thereof. A planarization process, such as a CMP, may be performed to remove excess materials.

Figure 6C:
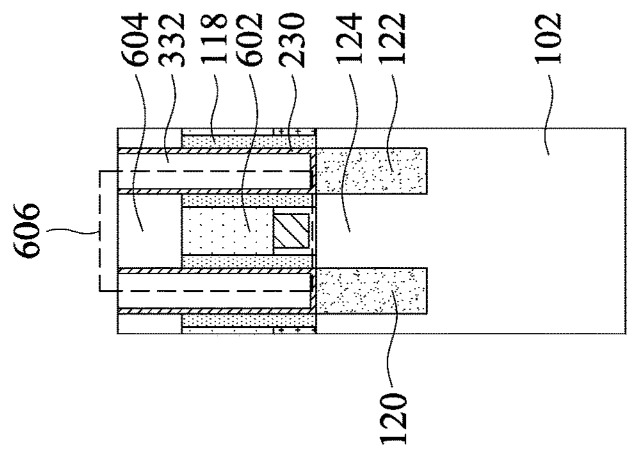
Figure 6B:
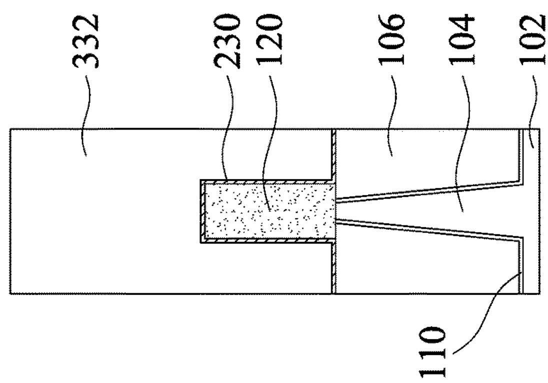
Figure 6A:
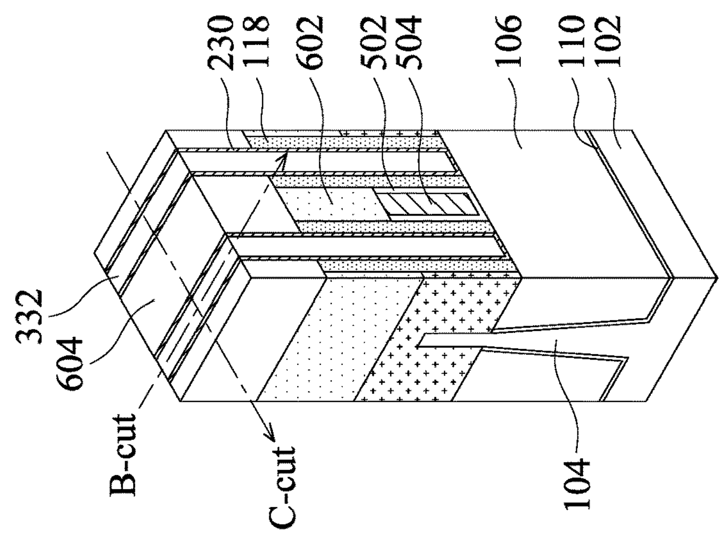

Referring now to FIGS. 6A-6C, there is illustrated the recessing of the gate electrode 504 and the gate dielectric layer 502, and formation of a gate mask 602 and a capping layer 604 over remaining portions of the gate electrode 504 and the gate dielectric layer 502 in accordance with some embodiments. In some embodiments, the gate electrode 504 may be recessed using, for example, dry etch process using $Cl_2/O_2/BCl_3$.

After recessing the gate electrode 504 and the gate dielectric layer 502, the gate mask 602 may be formed in the recess to protect the gate electrode 504 and the gate dielectric layer 502 during subsequent processes. In some embodiments, the gate mask 602 may comprise $SiO_2$, SiCN, SiON, $Si_3N_4$, $Al_2O_3$, $La_2O_3$, $SiN_xH_y$, a combination thereof, or the like, but other suitable dielectric film may be used. The gate mask 602 may be formed using, for example, ALD, CVD, PVD, spin-on, or the like. Other suitable process steps may be used. The capping layer 604 may comprise amorphous silicon (a-Si), silicon oxycarbide (SiOC), silicon carbide (SiC), silicon nitride (SiN), a combination thereof, or the like. The capping layer 604 may be formed using, for example, ALD, CVD, PVD, or the like. In an embodiment, the gate mask 602 may have a thickness from about 30 nm and about 60 nm. In an embodiment, the capping layer 604 may have a thickness from about 10 nm and about 30 nm.

A planarization process, such as a CMP, may be performed to remove excess materials overfilling the recess. Furthermore, the planarization process exposes a top surface of the ILD 332. More detailed process flow for forming the gate mask 602 and the capping layer 604 will be described below with reference to FIGS. 9A-9I.

Figure 7C:
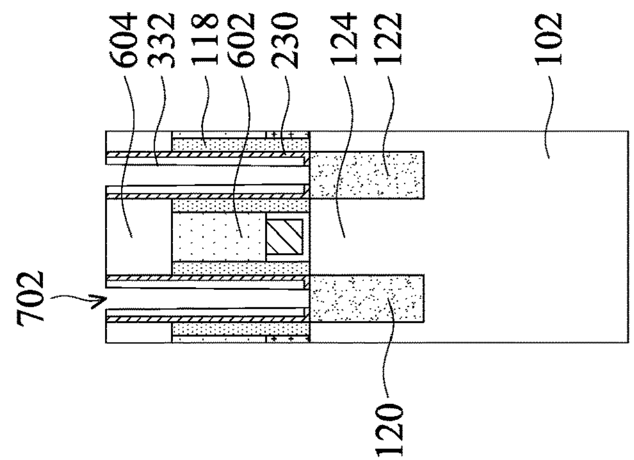
Figure 7B:
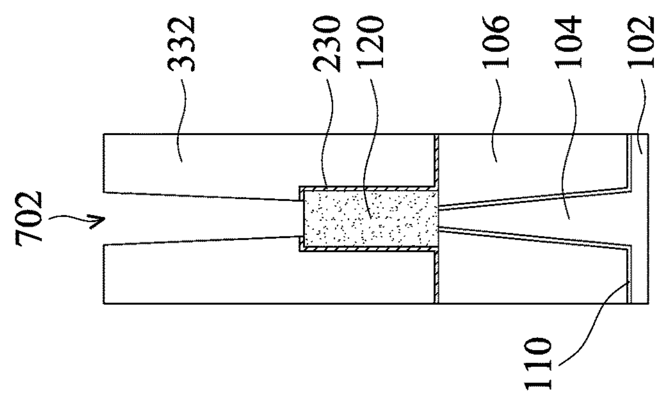
Figure 7A:
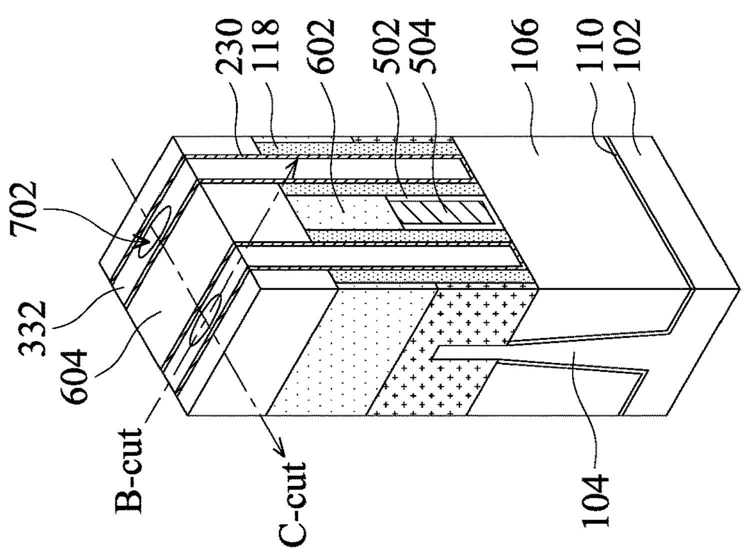

FIGS. 7A-7C further illustrate formation of openings 702 in the ILD 332 in in accordance with some embodiments. As described below in greater detail contact are formed in the openings 702. In some embodiments, the ILD 332 may be patterned using suitable photolithography and etch processes to form the openings 702. The openings 702 expose the first source/drain region 120 and the second source/drain region 122.

Figure 8C:
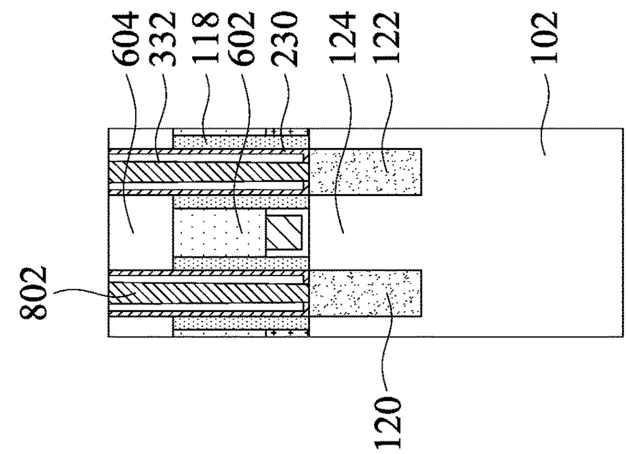
Figure 8B:
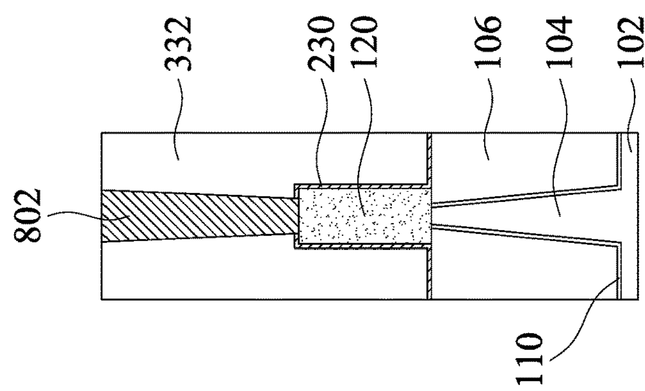
Figure 8A:
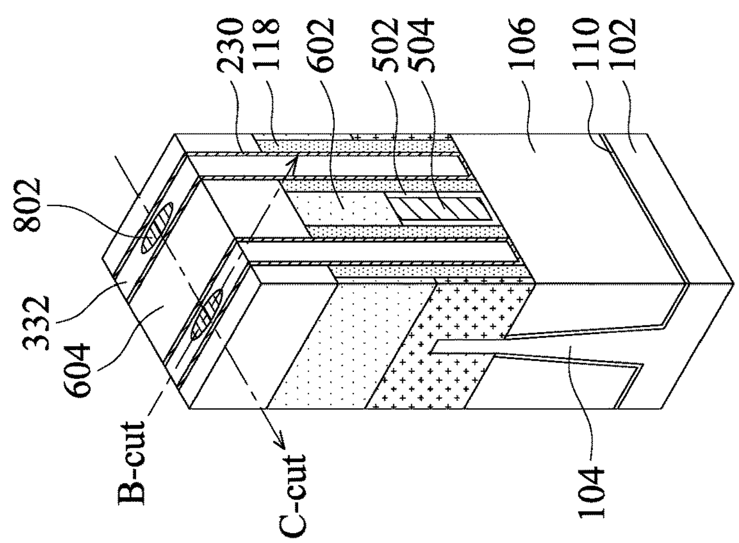

Referring now to FIGS. 8A-8C, there is shown formation of contacts 802 in the openings 702 (see FIGS. 7A-7C) in accordance with some embodiments. The contacts 802 may comprise a single layer or a multi-layer structure. For example, in some embodiments, the contacts 802 comprise a liner, such as a diffusion barrier layer, an adhesion layer, or the like, and a contact filler formed over the contact liner in the openings 702. The contact liner may include Ti, TiN, Ta, TaN, or the like, formed by ALD, CVD, PVD, or the like. The contact filler may be formed by depositing a conductive material, such as one or more layers of Ni, Ta, TaN, W, Co, Ti, TiN, Al, Cu, Au, alloys thereof, combinations thereof, or the like. A planarization process, such as a CMP, may be performed to remove excess material from a top surface of the ILD 332.

Other processes may be performed. For example, in some embodiments a metal silicide may be formed over the first source/drain regions 120 and the second source/drain regions 122. In some embodiments, a metal silicide formation process is performed after the formation of the openings 702 discussed above with reference to FIGS. 7A-7C. The metal silicide formation process may form a metal silicide on top of the doped source/drain regions to reduce Rc between the doped source/drain regions and the contact metal formed thereafter. In an embodiment, the metal silicide formation process includes a metal film deposition on top of the source/drain regions, a thermal treatment to form a metal silicide at the interface between the source/drain regions and the metal film, and an etching process to remove the excess unreacted metal. The metal silicide may comprise $TiSi_x$, $NiSi_x$, $CoSi_x$, $NiCoSi_x$, $TaSi_x$, a combination thereof, or the like.

Figure 9B:
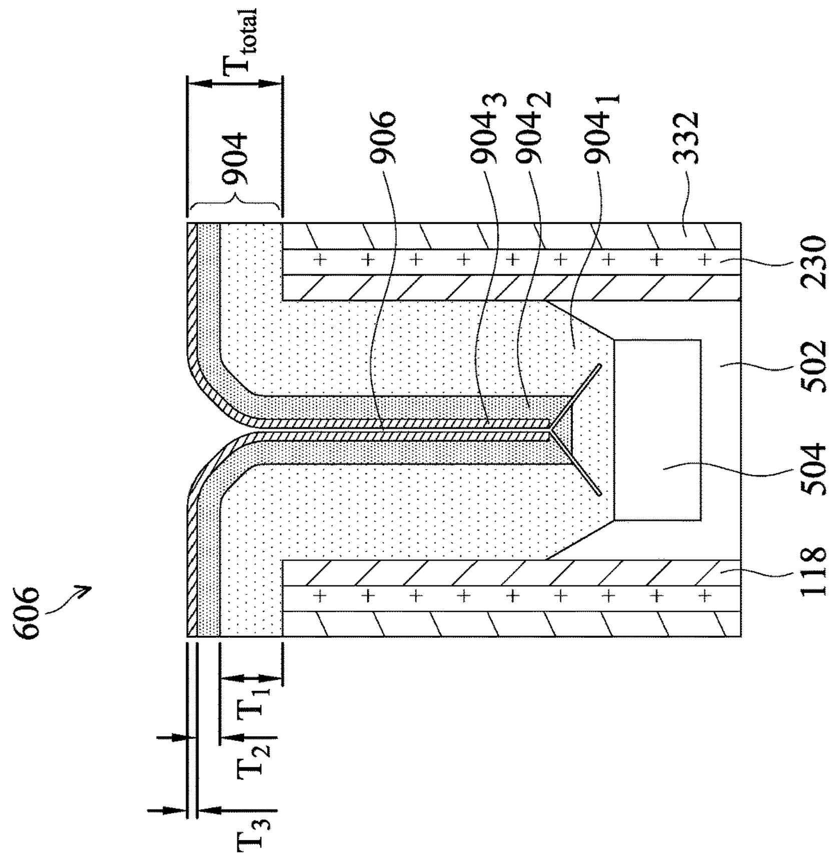
Figure 9A:
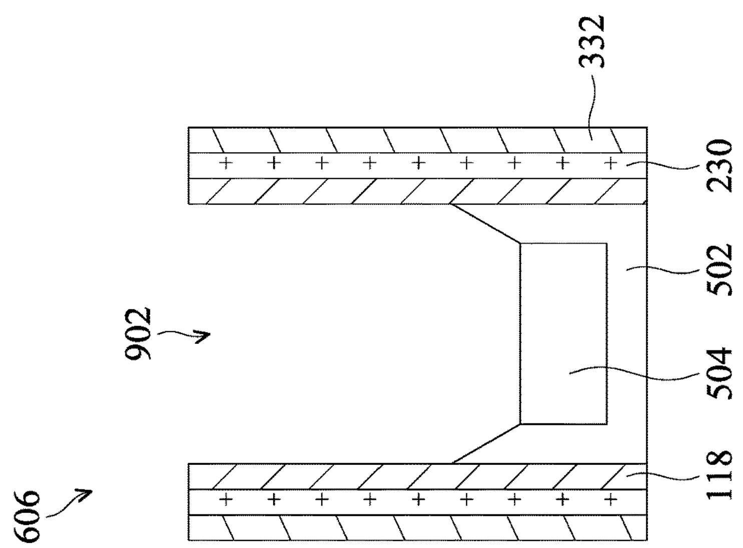

FIGS. 9A-9I illustrate various intermediate steps in a fabrication process of the gate mask 602 and the capping layer 604 in accordance with some embodiments. FIGS. 9A-9I illustrate magnified cross-sectional view of a region 606 illustrated in FIG. 6C. Referring first to FIG. 9A, a structure of the region 606 is illustrated after recessing the gate electrode 504 and the gate dielectric layer 502 to form a recess 902.

FIG. 9B illustrates formation of a multi-layer film 904 in the recess 902 (see FIG. 9A). In some embodiments, the multi-layer film 904 comprises a first film $\mathbf{904}_1$, a second film $\mathbf{904}_2$ over the first film $\mathbf{904}_1$, and a third film $\mathbf{904}_3$ over the second film $\mathbf{904}_2$. In some embodiments, the first film $\mathbf{904}_1$ may have a thickness $T_1$ from about 10 nm to about 13 nm. In some embodiments, the thickness $T_1$ of the first film $\mathbf{904}_1$ the may be about 40% of the total thickness $T_{total}$ of the multi-layer film 904. In some embodiments, the second film $\mathbf{904}_2$ may have a thickness $T_2$ from about 10 nm to about 13 nm. In some embodiments, the thickness $T_2$ of the second film $\mathbf{904}_2$ the may be about 40% of the total thickness $T_{total}$ of the multi-layer film 904. In some embodiments, the third film $\mathbf{904}_3$ may have a thickness $T_3$ from about 3 nm to about 5 nm. In some embodiments, the thickness $T_3$ of the third film $\mathbf{904}_3$ the may be about 20% of the total thickness $T_{total}$ of the multi-layer film 904. In some embodiments, the multi-layer film 904 may comprise $SiO_2$, SiCN, SiON, $Si_3N_4$, $Al_2O_3$, $La_2O_3$, $SiN_xH_y$, a combination thereof, or the like. The multi-layer film 904 may be formed using, for example, ALD, CVD, PVD, spin-on, a combination thereof, or the like. In some embodiments, the multi-layer film 904 is conformally deposited in the recess, and after the deposition, the multi-layer film 904 comprises a seam 906 where layers of the multi-layer film 904 deposited on sidewalls and a bottom of the recess 902 meet in the interior of the recess 902. As described below in greater detail, the multi-layer film 904 is recessed to form the gate mask 602 in the recess 902.

In some embodiments where the first film $\mathbf{904}_1$ comprises silicon nitride, the first film $\mathbf{904}_1$ may be conformally deposited using an ALD process with a precursor gas mixture comprising ammonia ($NH_3$) and $H_2SiCl_2$ (dichlorosilane). Diluting gases such as $H_2$ and Ar may also be used during the deposition. In some embodiments, the deposition process may be performed for a time from about 4000 sec to about 6000 sec, at a temperature from about 450° C. to about 550° C., and at a pressure from about 1.5 Torr to about 3 Torr. In some embodiments, relative amounts of precursor gases may be varied to alter properties of the first film $\mathbf{904}_1$, such as an etch rate. In some embodiments, by varying relative amounts of precursor gases, chlorine (Cl) content in the first film $\mathbf{904}_1$ may be altered. In some embodiments, by increasing Cl content in the first film $\mathbf{904}_1$, the etch rate of the first film $\mathbf{904}_1$ may be increased.

After forming the first film $\mathbf{904}_1$, the second film $\mathbf{904}_2$ is deposited over the first film $\mathbf{904}_1$. In some embodiments where the second film $\mathbf{904}_2$ comprises silicon nitride, the second film $\mathbf{904}_2$ may be conformally deposited using an ALD process with a precursor gas mixture comprising ammonia ($NH_3$) and $H_2SiCl_2$ (dichlorosilane). Diluting gases such as $H_2$ and Ar may also be used during the deposition. In some embodiments, the deposition process may be performed for a time from about 3000 sec to about 5000 sec, at a temperature from about 450° C. to about 550° C., and at a pressure from about 1.5 Torr to about 3 Torr. In some embodiments, relative amounts of precursor gases may be varied to alter properties of the second film $\mathbf{904}_2$, such as an etch rate. In some embodiments, Cl content in the second film $\mathbf{904}_2$ may be altered to alter an etch rate of the second film $\mathbf{904}_2$. In some embodiments, Cl content may be altered by varying relative amounts of precursor gases during the deposition. In some embodiments, an amount of Cl in the second film $\mathbf{904}_2$ may be from about 2% to about 5% by weight. In some embodiments, the second film $\mathbf{904}_2$ has less Cl content than the first film $\mathbf{904}_1$. Consequently, the etch rate of the first film $\mathbf{904}_1$ may be greater than the etch rate of the second film $\mathbf{904}_2$ with respect to a subsequently used etching process. Accordingly, the first film $\mathbf{904}_1$ may be also referred as a soft film and the second film $\mathbf{904}_2$ may also be referred to as a hard film.

After forming the second film $\mathbf{904}_2$, the third film $\mathbf{904}_3$ is deposited over the second film $\mathbf{904}_2$. In some embodiments where the third film $\mathbf{904}_3$ comprises silicon nitride, the third film $\mathbf{904}_3$ may be conformally deposited using an ALD process with a precursor gas mixture comprising ammonia ($NH_3$) and $H_2SiCl_2$ (dichlorosilane). Diluting gases such as $H_2$ and Ar may also be used during the deposition. In some embodiments, the deposition process may be performed for a time from about 2000 sec to about 3000 sec, at a temperature from about 450° C. to about 550° C., and at a pressure from about 1.5 Torr to about 3 Torr.

After the deposition, in some embodiments, the third film $\mathbf{904}_3$ is subjected to a cure in an ambient of a gas mixture comprising $H_2SiCl_2$ (dichlorosilane) and $H_2$. Diluting gases such as Ar may also be used during the cure. In some embodiments, the cure may be performed for a time from about 200 sec to about 400 sec, and at a temperature from about 450° C. to about 550° C. The cure may alter the properties of the third film $\mathbf{904}_3$, such as an etch rate. In some embodiments, the cure increases silicon (Si) content of the third film $\mathbf{904}_3$ near the seam 906. By increasing the silicon content of the portions of the third film $\mathbf{904}_3$ near the seam 906, the etch rate of the third film $\mathbf{904}_3$ near the seam 906 is decreased with respect to a subsequently used etching process. In some embodiments, an amount of Si in the third film $\mathbf{904}_3$ may be from about 40% to about 50% by weight. As described below in greater detail, by forming the multi-layer film 904 having layers of varying etch rates as described above, the gate mask 602 may have substantially planar surface after etching the multi-layer film 904.

In alternative embodiments, the formation of the multi-layer film 904 may include forming the first film $\mathbf{904}_1$ followed by the cure, and formation of the second film $\mathbf{904}_2$ and the third film $904_3$ may be omitted. In alternative embodiments, the formation of the multi-layer film 904 may include forming the first film $904_1$ and forming the second film $904_2$ followed by the cure, and formation of the third film $904_3$ may be omitted. In alternative embodiments, the formation of the multi-layer film 904 may include forming the first film $904_1$ and forming the second film $904_2$, and formation of the third film $904_3$ and the cure may be omitted.

Figure 9D:
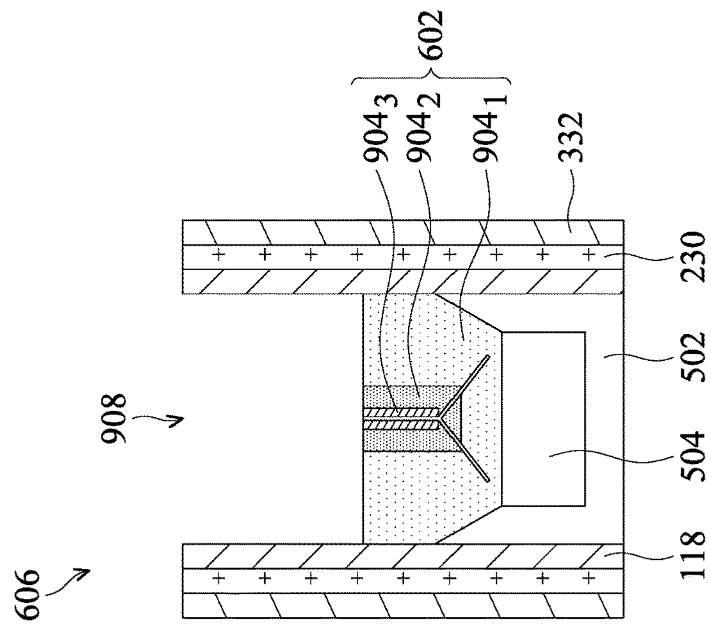
Figure 9C:
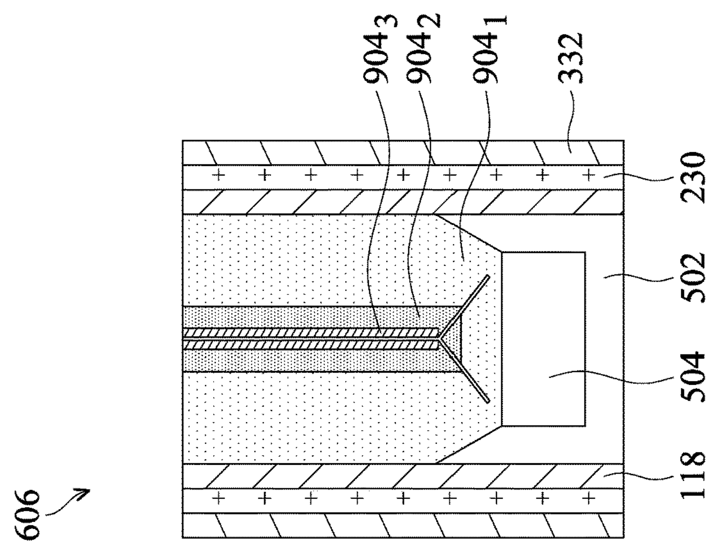

FIG. 9C illustrates removal of excess portions of the multi-layer film 904 overfilling the recess 902 (see FIG. 9A). In some embodiments, the excess portions of the multi-layer film 904 over the top surface of the ILD 332 are removed using, for example, an etch process, CMP, or the like.

FIG. 9D illustrates recessing of the multi-layer film 904 to form the gate mask 602 and a recess 908. In some embodiments, the recessing process may comprise selectively etching the multi-layer film 904 using either dry or wet etching. In some embodiments, wherein the multi-layer film 904 comprises silicon nitride and the dry etching is used, the process gas may include $CH_3F$, $O_2$, Ar, or a combination thereof. Other processes may be also used. In some embodiments, wherein the multi-layer film 904 comprises silicon nitride, the first film $904_1$ has a higher etch rate than the second film $904_2$ with respect to the etching process using the process gas including $CH_3F$, $O_2$, Ar, or a combination thereof. In some embodiments, wherein the multi-layer film 904 comprises silicon nitride, the etch rate of the third film $904_3$ near the seam 906 is decreased with respect to the etching process using the process gas including $CH_3F$, $O_2$, Ar, or a combination thereof. After the recessing, since the first film $904_1$ has a higher etch rate than the second film $904_2$, sidewalls of the recess 908 may be substantially free of a material of the first film $904_1$, which may improve recess filling process while forming the capping layer 604 (see FIGS. 6A-6C). Furthermore, by decreasing the etch rate of the third film $904_3$ near the seam 906, undesired seam opening may be reduced or avoided. In some embodiments, the gate mask 602 may have a substantially level top surface, such that a shape of the recess 908 is substantially rectangular.

Figure 9F:
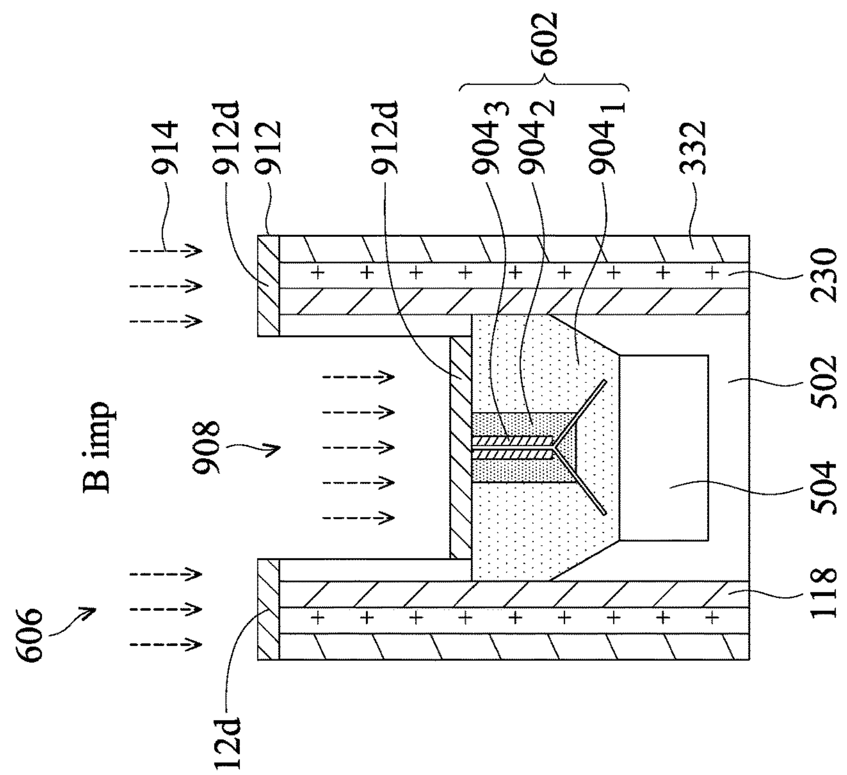
Figure 9E:
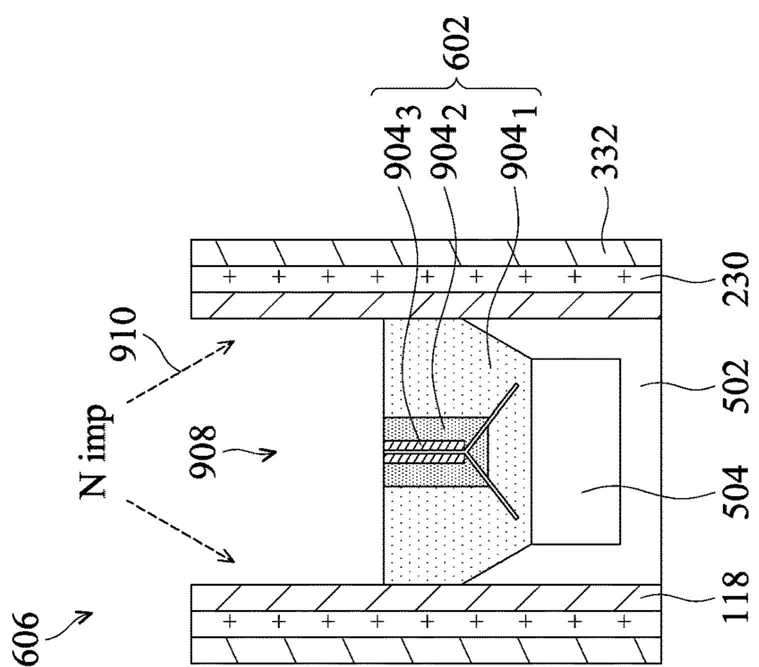

FIG. 9E illustrates nitrogen (N)-doping 910 of the sidewall spacers 118 exposed by the recess 908. In some embodiments, the N-doping 910 alters properties of the sidewall spacers 118, such as an etch rate. In some embodiments, the N-doping 910 decreases the etch rate of the doped portions of the sidewall spacers 118. In some embodiments, an amount of N in the doped portions of the sidewall spacers 118 may be from about 10% to about 20% by weight.

FIG. 9F illustrates formation of a cap layer 912 in the recess 908. In some embodiments, the cap layer 912 may comprise silicon (Si), silicon carbide (SiC), spin-on-carbon (SoC), or the like, and may be formed using, for example, ALD, CVD, spin-on, or the like. In some embodiments, boron (B)-doping 914 is performed on lateral portions of the cap layer 912, which alters properties of the cap layer 912, such as an etch rate. In some embodiments, B-doped portions **912*d* of the cap layer 912 have a lower etch rate than undoped portions of the cap layer 912. In some embodiments, an amount of B in the B-doped portions 912*d* of the cap layer 912** may be from about 10% to about 20% by weight.

Figure 9H:
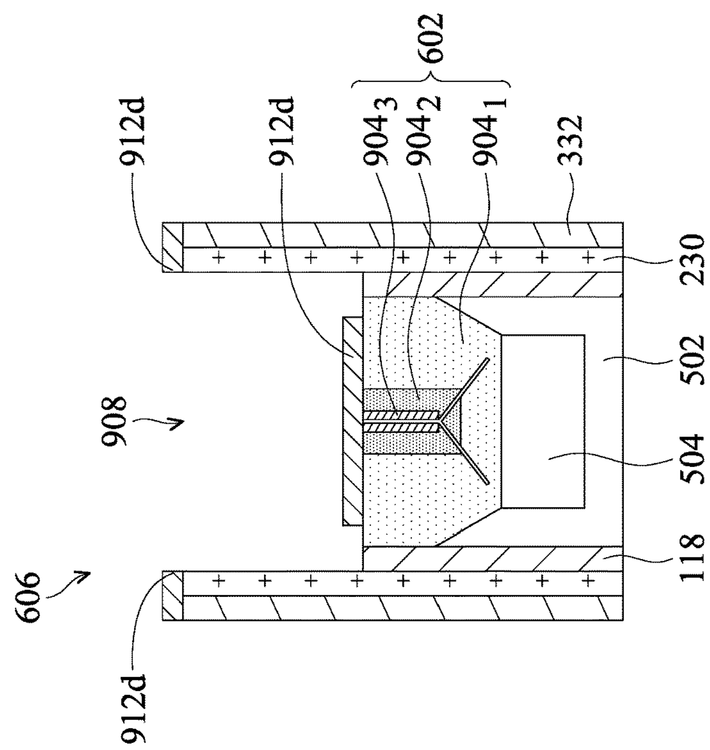
Figure 9G:
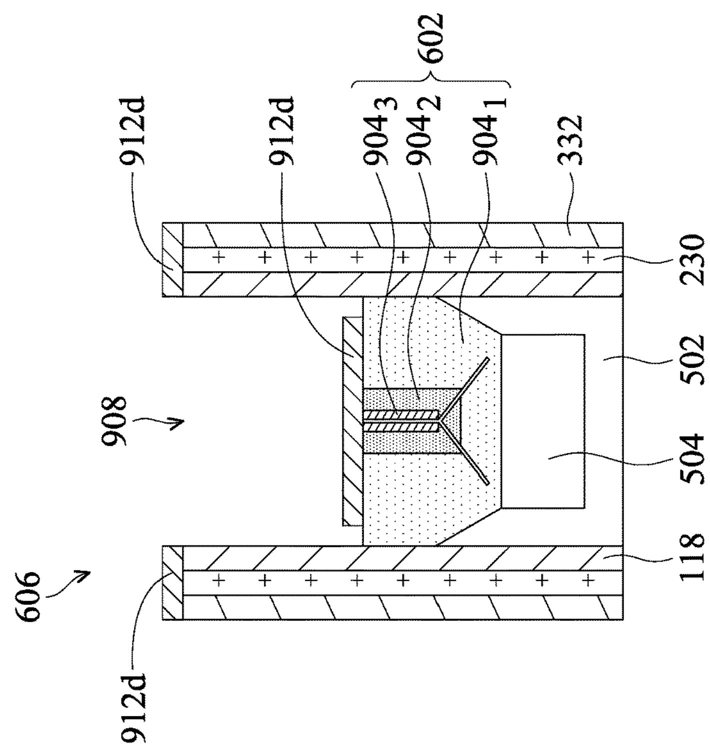

FIG. 9G illustrates selective removal of the undoped portions of the cap layer 912. In some embodiments where the cap layer 912 comprises Si, the undoped portions of the cap layer 912 may be removed in a wet etch process using $NH_4OH$. After the selective removal, the B-doped portions **912*d* of the cap layer 912 remain in the recess 908 and on the top surface of the ILD 332**.

FIG. 9H illustrates selective removal of the sidewall spacers 118 along the sidewalls of the recess 908. In some embodiments where the sidewall spacers 118 comprise silicon nitride, the sidewall spacers 118 may be removed in a wet etch process using $H_3PO_4$. In some embodiments, after the selective removal, portions of the liner dielectric film 230 are exposed in the recess 908.

Figure 9I:
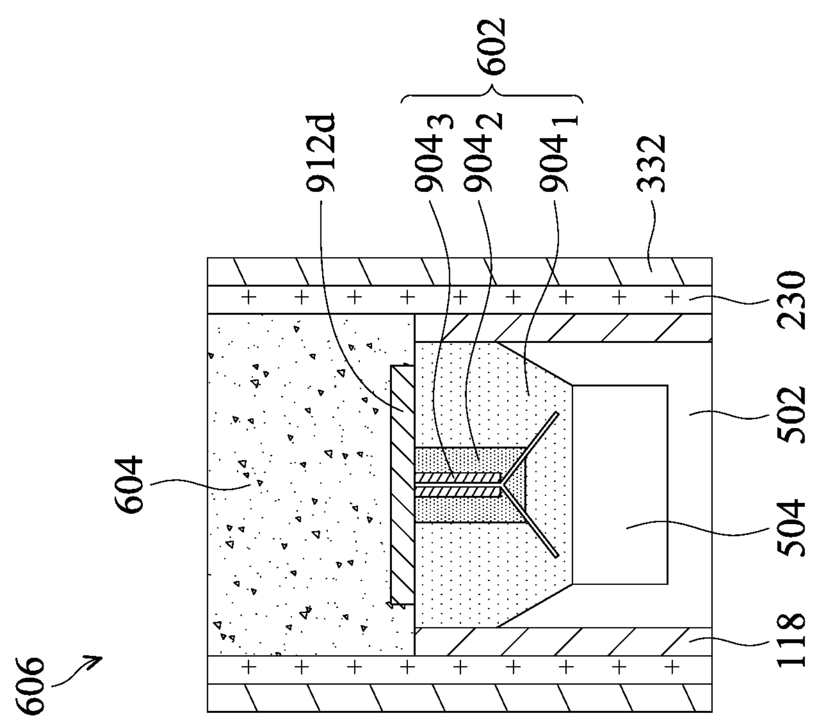

FIG. 9I illustrates formation of the capping layer 604 in the recess 908. The capping layer 604 may comprise amorphous silicon (a-Si), or the like. The capping layer 604 may be formed using, for example, ALD, CVD, PVD, or the like. A planarization process, such as a CMP, may be performed to remove excess materials overfilling the recess 908. Furthermore, the planarization process removes the B-doped portions **912*d* of the cap layer 912 from the top surface of the ILD 332 and exposes the top surface of the ILD 332**.

Figure 10:
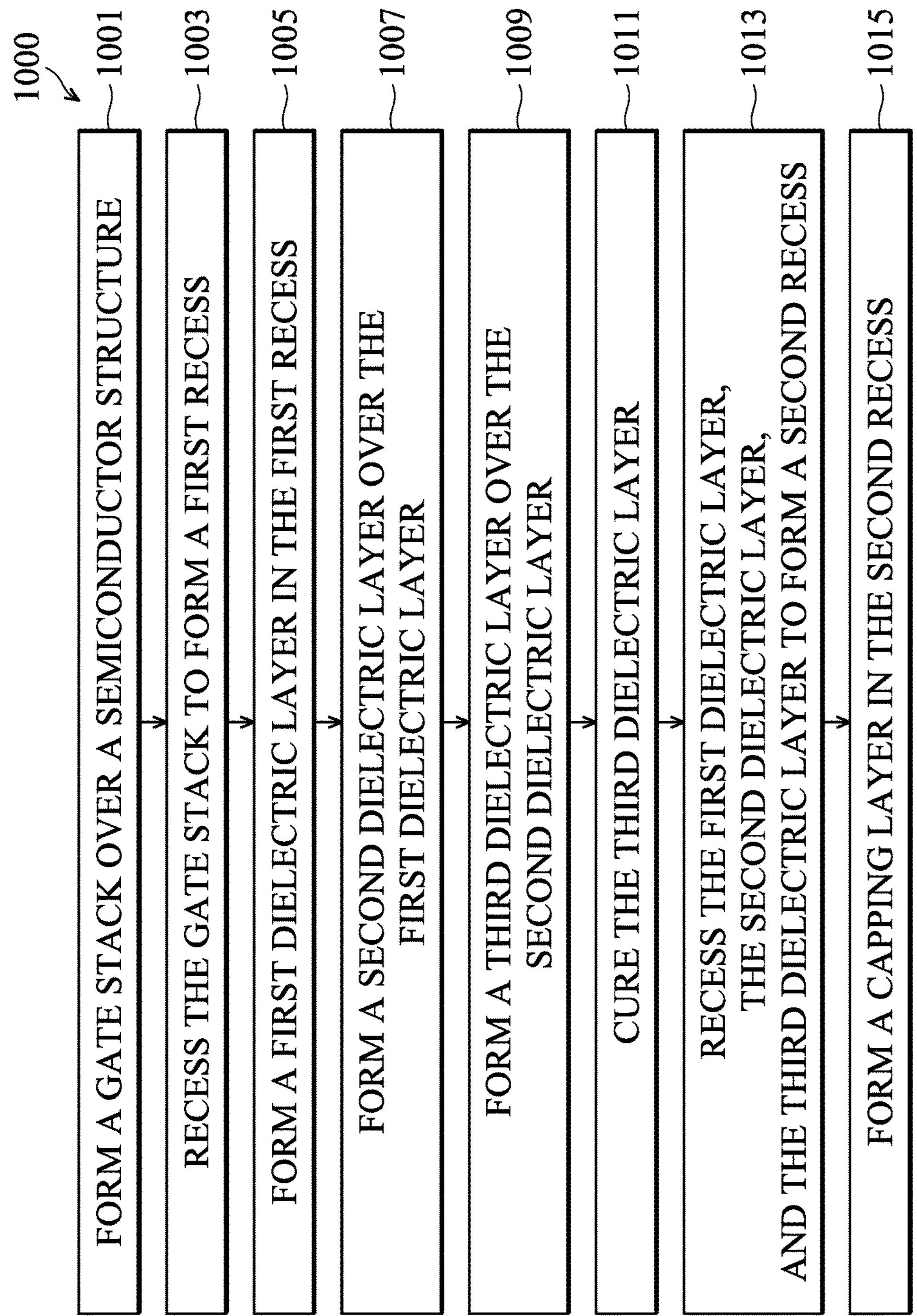
FIG. 10 is a flow diagram illustrating a method of forming a device in accordance with some embodiments.

FIG. 10 is a flow diagram illustrating a method 1000 of forming a device in accordance with some embodiments. The method 1000 starts with step 1001, where a gate stack (such as the gate dielectric layer 502 and the gate electrode 504 illustrated in FIGS. 5A-5C) is formed over a semiconductor structure as described above with reference to FIGS. 5A-5C. In step 1003, the gate stack is recessed to form a first recess (such as the recess 902 illustrated in FIG. 9A) as described above with reference to FIG. 9A. In step 1005, a first dielectric layer (such as the first film $904_1$ illustrated in FIG. 9B) is formed along a bottom and sidewalls of the first recess as described above with reference to FIG. 9B. In step 1007, a second dielectric layer (such as the second film $904_2$ illustrated in FIG. 9B) is formed over the first dielectric layer as described above with reference to FIG. 9B. In step 1009, a third dielectric layer (such as the third film $904_3$ illustrated in FIG. 9B) is formed over the second dielectric layer as described above with reference to FIG. 9B. In step 1011, the third dielectric layer is cured as described above with reference to FIG. 9B. In step 1013, the first dielectric layer, the second dielectric layer, and the third dielectric layer are recessed to form a second recess (such as the recess 908 illustrated in FIG. 9D) as described above with reference to FIGS. 9C and 9D. In step 1015, a capping layer (such as the capping layer 604 illustrated in FIG. 9I) is formed in the second recess as described above with reference to FIGS. 9E-9I. In alternative embodiments, the steps 1007, 1009, and/or 1011 may be omitted.

Various embodiments discussed herein allow for seam open prevention, sidewall residue reduction, and recess profile improvement during etch back process to form the gate mask 602. Various embodiments further allow for reducing manufacturing steps and improving formation process window for the capping layer 604.

According to an embodiment, a method includes: forming a gate stack over a semiconductor structure; recessing the gate stack to form a first recess; forming a first dielectric layer along a bottom and sidewalls of the first recess, the first dielectric layer having a first etch rate; forming a second dielectric layer over the first dielectric layer, the second dielectric layer having a second etch rate, the first etch rate being higher than the second etch rate; forming a third dielectric layer over the second dielectric layer; altering an etch rate of a portion of the third dielectric layer; recessing the first dielectric layer, the second dielectric layer, and the third dielectric layer to form a second recess; and forming a capping layer in the second recess. In an embodiment, the method further includes forming a spacer along a sidewall of the gate stack. In an embodiment, recessing the first dielectric layer, the second dielectric layer, and the third dielectric layer further includes exposing a portion of the spacer. In an embodiment, the method further includes removing the portion of the spacer. In an embodiment, altering the etch rate of the portion of the third dielectric layer includes curing the portion of the third dielectric layer to decrease the etch rate of the portion of the third dielectric layer. In an embodiment, the curing is performed in an ambient of a gas mixture comprising $H_2SiCl_2$ (dichlorosilane) and $H_2$. In an embodiment, the second dielectric layer has less Cl content than the first dielectric layer.

According to another embodiment, a method includes: forming a gate stack over a semiconductor structure; forming a spacer on a sidewall of the gate stack; etching the gate stack to form a first recess; conformally depositing a first dielectric layer in the first recess, the first dielectric layer having a first etch rate; conformally depositing a second dielectric layer over the first dielectric layer, the second dielectric layer having a second etch rate, the first etch rate being higher than the second etch rate; conformally depositing a third dielectric layer over the second dielectric layer, the third dielectric layer having a third etch rate; curing the third dielectric layer, a cured portion of the third dielectric layer having a lower etch rate than the third etch rate; and etching the first dielectric layer, the second dielectric layer, and the third dielectric layer to form a second recess, the second recess exposing a portion of the spacer, remaining portions of the first dielectric layer, the second dielectric layer, and the third dielectric layer forming a gate mask. In an embodiment, the method further includes, after forming the gate mask, etching the spacer to remove the portion of the spacer. In an embodiment, the method further includes, after etching the spacer, forming a capping layer over the gate mask and a remaining portion of the spacer. In an embodiment, a width of the capping layer is greater than a width of the gate mask. In an embodiment, the curing is performed in an ambient of a gas mixture comprising $H_2SiCl_2$ (dichlorosilane) and $H_2$. In an embodiment, the curing increases Si content of the cured portion of the third dielectric layer. In an embodiment, the second dielectric layer has less Cl content than the first dielectric layer.

According to yet another embodiment, a device includes: a gate stack over a semiconductor structure, the semiconductor structure having a first source/drain region, a second source/drain region, and a channel region interposed between the first source/drain region and the second source/drain region, the gate stack being over the channel region; a gate mask over the gate stack, the gate mask comprising: a first dielectric layer over the gate stack, the first dielectric layer having a first etch rate; a second dielectric layer over the first dielectric layer, the second dielectric layer having a second etch rate, the first etch rate being higher than the second etch rate; and a third dielectric layer over the second dielectric layer, a first portion of the third dielectric layer having a lower etch rate than a second portion of the third dielectric layer; and a capping layer over the gate mask. In an embodiment, the device further includes a spacer extending along a sidewall of the gate stack and along a sidewall of the gate mask. In an embodiment, the capping layer extends along a top surface of spacer. In an embodiment, a width of the capping layer is greater than a width of the gate mask. In an embodiment, the second dielectric layer has less Cl content than the first dielectric layer. In an embodiment, the second portion of the third dielectric layer has less Si content than the first portion of the third dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a gate stack over a semiconductor structure;

recessing the gate stack to form a first recess;

forming a first dielectric layer along a bottom and sidewalls of the first recess, the first dielectric layer having a first etch rate;

forming a second dielectric layer over the first dielectric layer, the second dielectric layer having a second etch rate, the first etch rate being higher than the second etch rate;

forming a third dielectric layer over the second dielectric layer;

altering an etch rate of a portion of the third dielectric layer;

recessing the first dielectric layer, the second dielectric layer, and the third dielectric layer to form a second recess; and forming a capping layer in the second recess.

2. The method of claim 1, further comprising forming a spacer along a sidewall of the gate stack.

3. The method of claim 2, wherein recessing the first dielectric layer, the second dielectric layer, and the third dielectric layer further comprises exposing a portion of the spacer.

4. The method of claim 3, further comprising removing the portion of the spacer.

5. The method of claim 1, wherein altering the etch rate of the portion of the third dielectric layer comprises curing the portion of the third dielectric layer to decrease the etch rate of the portion of the third dielectric layer.

6. The method of claim 5, wherein the curing is performed in an ambient of a gas mixture comprising $H_2SiCl_2$ (dichlorosilane) and $H_2$.

7. The method of claim 1, wherein the second dielectric layer has less Cl content than the first dielectric layer.

8. A method comprising:

forming a gate stack over a semiconductor structure;

forming a spacer on a sidewall of the gate stack;

etching the gate stack to form a first recess;

conformally depositing a first dielectric layer in the first recess, the first dielectric layer having a first etch rate;

conformally depositing a second dielectric layer over the first dielectric layer, the second dielectric layer having a second etch rate, the first etch rate being higher than the second etch rate;

conformally depositing a third dielectric layer over the second dielectric layer, the third dielectric layer having a third etch rate;

curing the third dielectric layer, a cured portion of the third dielectric layer having a lower etch rate than the third etch rate; and etching the first dielectric layer, the second dielectric layer, and the third dielectric layer to form a second recess, the second recess exposing a portion of the spacer, remaining portions of the first dielectric layer, the second dielectric layer, and the third dielectric layer forming a gate mask.

9. The method of claim 8, further comprising, after forming the gate mask, etching the spacer to remove the portion of the spacer.

10. The method of claim 9, further comprising, after etching the spacer, forming a capping layer over the gate mask and a remaining portion of the spacer.

11. The method of claim 10, wherein a width of the capping layer is greater than a width of the gate mask.

12. The method of claim 8, wherein the curing is performed in an ambient of a gas mixture comprising $H_2SiCl_2$ (dichlorosilane) and $H_2$.

13. The method of claim 8, wherein the curing increases Si content of the cured portion of the third dielectric layer.

14. The method of claim 8, wherein the second dielectric layer has less Cl content than the first dielectric layer.

15. A device comprising:

a gate stack over a semiconductor structure, the semiconductor structure having a first source/drain region, a second source/drain region, and a channel region interposed between the first source/drain region and the second source/drain region, the gate stack being over the channel region;

a gate mask over the gate stack, the gate mask comprising:

a first dielectric layer over the gate stack, the first dielectric layer having a first Cl content;

a second dielectric layer over the first dielectric layer, the second dielectric layer having a second Cl content, the first Cl content being different from the second Cl content; and a third dielectric layer over the second dielectric layer, a first portion of the third dielectric layer having a lower etch rate than a second portion of the third dielectric layer; and a capping layer over the gate mask.

16. The device of claim 15, further comprising a spacer extending along a sidewall of the gate stack and along a sidewall of the gate mask.

17. The device of claim 16, wherein the capping layer extends along a top surface of spacer.

18. The device of claim 15, wherein a width of the capping layer is greater than a width of the gate mask.

19. The device of claim 15, wherein the first Cl content is greater than the second Cl content.

20. The device of claim 15, wherein the second portion of the third dielectric layer has less Si content than the first portion of the third dielectric layer.

* * * * *